US008830674B2

(12) United States Patent
Qu

(10) Patent No.: US 8,830,674 B2
(45) Date of Patent: Sep. 9, 2014

(54) COOLING SYSTEM AND ELECTRONIC DEVICE INCLUDING THE COOLING SYSTEM

(75) Inventor: Zhijun Qu, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 190 days.

(21) Appl. No.: 13/547,482

(22) Filed: Jul. 12, 2012

(65) Prior Publication Data
US 2013/0107452 A1 May 2, 2013

(30) Foreign Application Priority Data

Nov. 1, 2011 (CN) .......................... 2011 1 0339954

(51) Int. Cl.
*H05K 7/20* (2006.01)
*G06F 1/20* (2006.01)
*H05K 7/14* (2006.01)
*H01L 23/34* (2006.01)

(52) U.S. Cl.
CPC ................ *G06F 1/20* (2013.01); *H05K 7/1445* (2013.01); *H05K 7/20572* (2013.01)
USPC .................... 361/679.49; 361/679.5; 361/695; 454/185

(58) Field of Classification Search
CPC ................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ....................... 361/679.48–679.51, 688–723, 361/724–727, 679.33–679.39, 679.47, 361/679.52–679.54, 679.6; 454/184; 312/236; 174/15.1–15.3, 16.1–16.3; 165/80.1–80.3, 185, 104.33
See application file for complete search history.

(56) References Cited

U.S. PATENT DOCUMENTS 7,369,406 B2 * 5/2008 Matsushima et al. ......... 361/695
7,508,338 B2 * 3/2009 Pluymers et al. ............. 342/175
(Continued)

FOREIGN PATENT DOCUMENTS

EP 2141974 A2 1/2010

OTHER PUBLICATIONS

Extended European Search Report issued in corresponding European Patent Application No. 12177097.8, mailed Oct. 9, 2012.
(Continued)

*Primary Examiner* — Zachary M Pape
*Assistant Examiner* — Razmeen Gafur
(74) *Attorney, Agent, or Firm* — Brinks Gilson & Lione

(57) ABSTRACT

The present disclosure discloses a cooling system and an electronic device. The cooling system is configured to cool a circuit board assembly in an orthogonal architecture, where the circuit board assembly is arranged inside a cabinet. The cooling system includes: a first cooling air duct that allows air to flow from the front area of the cabinet corresponding to the region of the circuit board assembly into the cabinet and flow through the front portion of the circuit board assembly, then be distributed into two lateral sides of the circuit board assembly, and be discharged out of the cabinet; and a second cooling air duct that allows air to flow from the front area of the cabinet corresponding to one end of the circuit board assembly into the cabinet and through the rear portion of the circuit board assembly, and then be discharged out of the cabinet.

7 Claims, 5 Drawing Sheets

(56) References Cited

U.S. PATENT DOCUMENTS

| | | | |
|---|---|---|---|
| 7,724,515 B2 * | 5/2010 | Fukuda et al. | 361/679.5 |
| 7,766,733 B2 * | 8/2010 | Kasahara et al. | 454/184 |
| 7,804,684 B1 * | 9/2010 | Aybay et al. | 361/679.5 |
| 7,808,792 B2 * | 10/2010 | Nguyen | 361/721 |
| 7,839,637 B2 * | 11/2010 | Pakravan | 361/695 |
| 7,885,066 B2 * | 2/2011 | Boyden et al. | 361/695 |
| 7,965,504 B2 * | 6/2011 | Hamlin | 361/695 |
| 2005/0207134 A1 * | 9/2005 | Belady et al. | 361/796 |
| 2009/0097202 A1 * | 4/2009 | Gipson | 361/695 |
| 2009/0135558 A1 * | 5/2009 | Hughes | 361/679.46 |
| 2011/0080701 A1 * | 4/2011 | Bisson et al. | 361/679.5 |

OTHER PUBLICATIONS

Office Action issued in corresponding European Patent Application No. 12177097.8, mailed Apr. 25, 2013.

* cited by examiner

COOLING SYSTEM AND ELECTRONIC DEVICE INCLUDING THE COOLING SYSTEM

CROSS-REFERENCE TO RELATED APPLICATION

This application claims priority to Chinese Patent Application 201110339954.1, filed on Nov. 1, 2011, which is hereby incorporated by reference in its entirety.

FIELD

The present disclosure relates to the field of electronic device cooling technologies, and in particular, to a cooling system with a good cooling effect and an electronic device including the cooling system.

BACKGROUND

With the standardization of the Ethernet at a higher rate, Ethernet port rates of current electronic devices such as a communication device are evolved from GE (Gigabit Ethernet, Gigabit Ethernet) to 10 GE, 40 GE, and 100 GE. Therefore, higher bandwidth and density requirements are imposed on an Ethernet switching device, and the Ethernet switching device is required to support serdes (parallel-to-serial converter and serial-to-parallel converter) links of higher rates.

A conventional Ethernet switching device generally builds a system based on a serializer/deserializer (serdes) of the rate of 3.125 Gbps or 6.25 Gbps and supports the Gigabit Ethernet (Gigabit Ethernet, GE). After new 10 GE, 40 GE, and 100 GE Ethernet standards are issued, to increase the utilization of physical links, the serdes rates are all evolved to 10.3 Gbps. Therefore, the Ethernet device is required to build a system based on a 10.3 Gbps link.

While supporting the 10.3 Gbps link, there is a strict requirement on the end-to-end cabling length of the system; if the requirement is not met, the operation of the entire link is unstable. Therefore, when the conventional large-scale Ethernet device supports high-speed links, because the cabling on the backplane is too long, the end-to-end serdes link is too long, and the insertion loss is too large, the link cannot work normally. In particular, under a high-temperature environment, if the link is too long, the working state is very unstable.

Based on this situation, to better support high-speed links, the Ethernet device gradually adopts an orthogonal architecture. In the orthogonal architecture, an orthogonal connector is adopted and both sides of the backplane are directly connected to an Ethernet line card and a switching line card, so that the cabling length of the high-speed link on the backplane is reduced to zero. In this way, the end-to-end high-speed link is the shortest, and the insertion loss is the smallest, and the high-speed link of the entire system works stably.

In the orthogonal architecture, although the cabling length of the link is reduced and the system bandwidth is increased, negative impacts are also produced. The largest impact is that the cooling air duct of the system is difficult to design. In particular, the cooling air duct under a specific condition is difficult to design, for example, when the cooling air duct is strictly required with front-air-in and rear-air-out.

Cooling solutions in the prior art are all left-air-in and right-air-out or right-air-in and left-air-out in combination with top-air-in and bottom-air-out or bottom-air-in and top-air-out, and mutually vertical cooling air ducts are adopted. The un-uniform cooling air ducts cause hybrid air flows between the cooling air ducts, and greatly affects the cooling efficiency of the device, thereby increasing power consumption of the device and reducing the reliability of the device.

SUMMARY

The present disclosure aims to overcome the above disadvantages of the prior art, and provides a cooling system and an electronic device including the cooling system to ensure that no hybrid air flows between cooling air ducts and that the device has a high cooling efficiency and small power consumption. Thereby, the reliability of the device is increased, and the service life of the device is prolonged.

A first aspect of the present disclosure provides a cooling system, which is configured to cool a circuit board assembly in an orthogonal architecture, where the circuit board assembly is arranged inside a cabinet. The cooling system includes: a first cooling air duct that allows air to flow from the front area of the cabinet corresponding to the region of the circuit board assembly into the cabinet and flow through the front portion of the circuit board assembly, then be distributed into two lateral sides of the circuit board assembly, and discharged out of the cabinet; and a second cooling air duct that allows air to flow from the front area of the cabinet corresponding to one end of the circuit board assembly into the cabinet and through the rear portion of the circuit board assembly, and then be discharged out of the cabinet.

A second aspect of the present disclosure provides an electronic device, including a cabinet and a circuit board assembly in an orthogonal architecture arranged inside the cabinet, where the electronic device includes the cooling system according to the first aspect.

A cooling system and an electronic device including the cooling system are provided in the present disclosure, where: by arranging a first cooling air duct and a second cooling air duct, the first cooling air duct allows air to enter from the front side of a cabinet corresponding to the central region of the circuit board assembly, and flow through the front portion of the circuit board assembly, then be distributed into two lateral sides of the circuit board assembly, and discharged out of the cabinet, and the second cooling air duct allows air to enter from the front side of the cabinet corresponding to the lower end region of the circuit board assembly, with the air vertically flowing through the second half part of the circuit board assembly from the bottom to the top. There is no hybrid air flows between the first cooling air duct and the second cooling air duct, and the device has a high cooling efficiency and small power consumption, thereby facilitating to increase the reliability of the device and prolong the service life of the device.

DETAILED DESCRIPTION OF THE EMBODIMENTS

To make the objective, technical solution, and advantage of the present disclosure clearer, the following describes the present disclosure in detail with reference to the accompanying drawings and exemplary embodiments. It is understandable that the exemplary embodiments are only used to explain the present disclosure and are not intended to limit the present disclosure.

Figure 1:
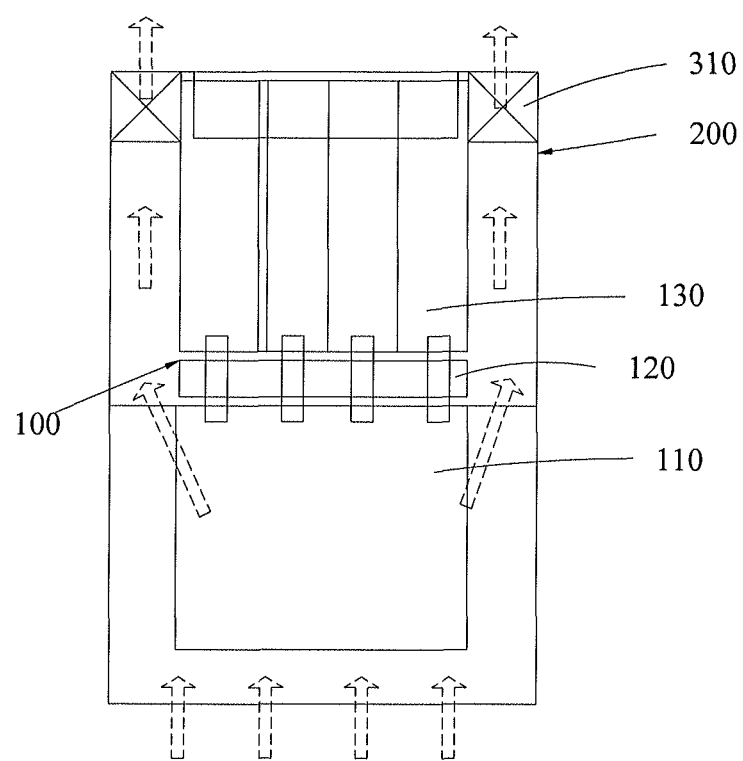
FIG. 1 is a schematic planform of a cooling system without the top side of a cabinet according to an embodiment of the present disclosure.

FIG. 1 is a schematic planform of a cooling system without the top side of a cabinet according to an embodiment of the present disclosure. As shown in FIG. 1, the cooling system is configured to cool a circuit board assembly 100 in an orthogonal architecture, where the circuit board assembly 100 is arranged inside a cabinet 200. The above cooling system includes: a first cooling air duct that allows air to flow from the front area of the cabinet 200 corresponding to the region of the circuit board assembly 100 into the cabinet 200 and flow through the front portion of the circuit board assembly 100, then be distributed into two lateral sides of the circuit board assembly 100, and discharged out of the cabinet 200; and a second cooling air duct that allows air to flow from the front area of the cabinet 200 corresponding to one end of the circuit board assembly 100 into the cabinet 200 and through the rear portion of the circuit board assembly 100, and then be discharged out of the cabinet 200. The first cooling air duct inhales the air from the front side of the cabinet 200 corresponding to the central region of the circuit board assembly 100, allows the air to flow through the first half part of the circuit board assembly 100, then be distributed into two lateral sides of the circuit board assembly 100, and discharged out of the cabinet 200 from the lateral sides or the back side of the cabinet 200 to cool the front portion of the circuit board assembly 100. In this embodiment, hot air in the first cooling air duct is discharged from the back side of the cabinet 200. In FIG. 1, the dotted arrow refers to the flow direction of the air in the first cooling air duct.

Specifically, the cabinet 200 includes a front side, a back side opposite to the front side, two opposite lateral sides, a top side, and a bottom side opposite to the top side. The front side, back side, two lateral sides, top side, and bottom side form together the cabinet 200 that can contain the circuit board assembly 100.

In this embodiment, the upper end of the circuit board assembly is connected to the top side of the cabinet 200, the lower end of the circuit board assembly 100 is separated from the bottom side of the cabinet 200, and two lateral sides of the circuit board assembly are separated from two lateral sides of the cabinet 200. By using such a layout, the first cooling air duct and the second cooling air duct are formed.

Figure 2:
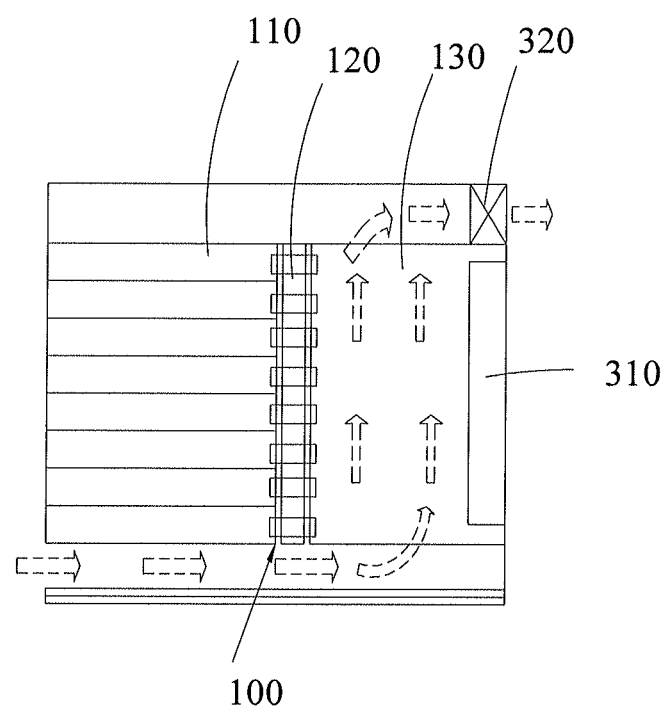
FIG. 2 is a right view of a cooling system without the lateral sides of a cabinet according to an embodiment of the present disclosure.

FIG. 2 is a right view of a cooling system without the lateral sides of a cabinet according to an embodiment of the present disclosure. Air in a second cooling air duct enters into a cabinet 200 from the front area of the lower end of a circuit board assembly 100, and directly flows into the lower end of the rear portion of the circuit board assembly 100, then vertically flows upward through the rear portion of the circuit board assembly 100, and is discharged from the back side of the cabinet 200 to cool the rear portion of the circuit board assembly 100. In FIG. 2, the dotted arrow refers to the flow direction of the air in the second cooling air duct. In the present disclosure, the cooling air ducts are arranged according to the heating regions of heating elements, thereby facilitating to increase the cooling effect. In addition, the first cooling air duct and the second cooling air duct do not interfere with each other, thereby avoiding hybrid air flows between different cooling air ducts, and facilitating to increase the cooling efficiency and reduce the cooling power consumption of the device. Furthermore, the front portion and the rear portion of the circuit board assembly 100 are both cooled by inhaling air directly from the outside of the cabinet 200, and can achieve even and good cooling effects. In this way, the heat generated by the circuit board assembly 100 can immediately be discharged out of the cabinet 200 through the first cooling air duct and the second cooling air duct, which facilitates the stable operation of the device and increases the reliability of the device. Further, the distances of the air ducts are short and the cooling efficiency is high, which facilitates to reduce the power consumption of the device.

Figure 3:
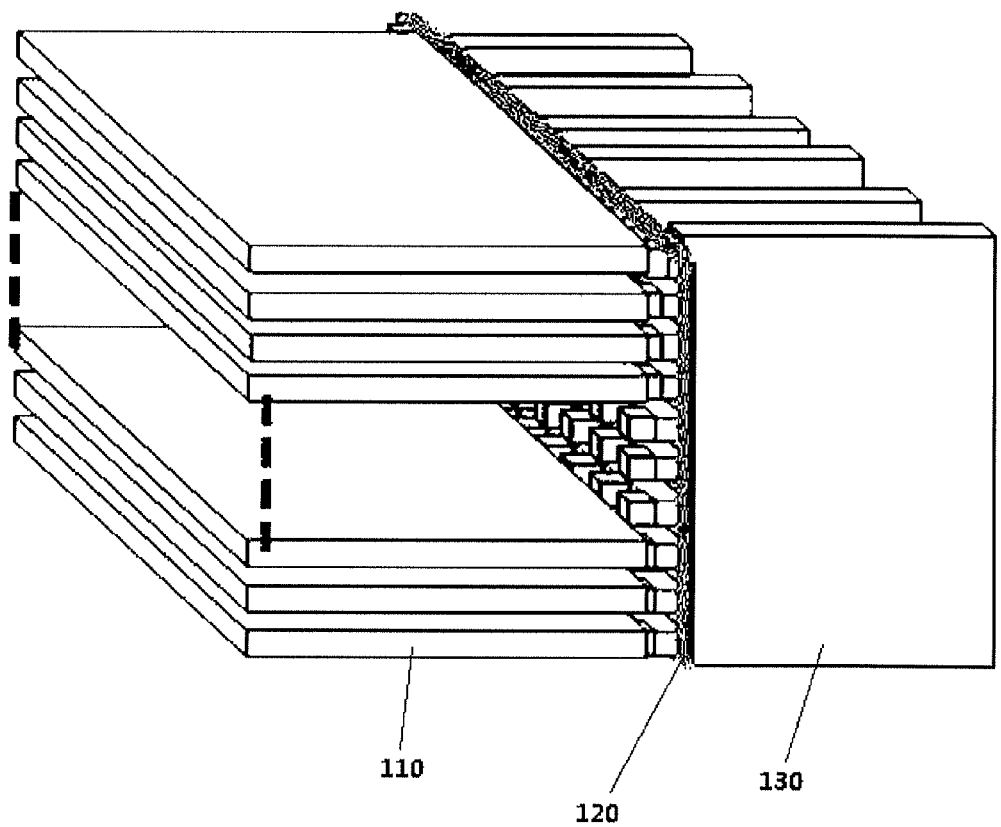
FIG. 3 is a schematic three-dimensional diagram of a circuit board assembly in an orthogonal architecture in a cooling system according to an embodiment of the present disclosure.

The cooling system provided in an embodiment of the present disclosure can reliably cool the circuit board assembly 100 in the orthogonal architecture even under the strict requirement of front-air-in and rear-air-out. As shown in FIG. 3, the circuit board assembly 100 in the orthogonal architecture includes a backplane 120 located in the middle portion of the circuit board assembly 100, a front circuit board 110 located in the front portion of the circuit board assembly 100, and a rear circuit board 130 located in the rear portion of the circuit board assembly 100, where the front circuit board 110 is inserted on one surface of the backplane 120, the rear circuit board 130 is inserted on the other surface of the backplane 120, and the rear circuit board 130 and the front circuit board 110 are vertical to each other. In this embodiment, the front circuit board 110 is horizontally connected to the front surface of the backplane 120 through a connector, the rear circuit board 130 is vertically connected to the back surface of the backplane 120 through a connector, and one or more front circuit boards 110 and rear circuit boards 130 may be arranged. The front circuit board 110 forms the front portion of the circuit board assembly 100, and the rear circuit board forms the rear portion of the circuit board assembly 100. Specifically, the circuit board assembly 100 may be fixed inside the cabinet 200 by a support bar, the backplane 120 of the circuit board assembly 100 is arranged in face of the front side of the cabinet 200, the front circuit board 110 is horizontally arranged, and the rear circuit board 130 is vertically arranged.

The front circuit board 110, the rear circuit board 130, and the backplane 120 may all be PCBs (Printed Circuit Board, printed circuit board). In addition, the circuit board assembly 100 may be in other proper forms. For example, the front circuit board 110 may also be vertically arranged relative to the backplane 120, and the rear circuit board 130 is horizontally arranged relative to the backplane 120. In specific applications, the number and orientation of the front circuit board 110 and the rear circuit board 130 may be determined according to the actual situation, which all fall within the protection scope of the present disclosure. In this embodiment, the front circuit board 110 is arranged horizontally and is parallel with the top side and bottom side of the cabinet 200, the rear circuit board 130 is arranged vertically and is parallel with two lateral sides of the cabinet 200, and the backplane 120 is parallel with the front side and back side of the cabinet 200.

Figure 4:
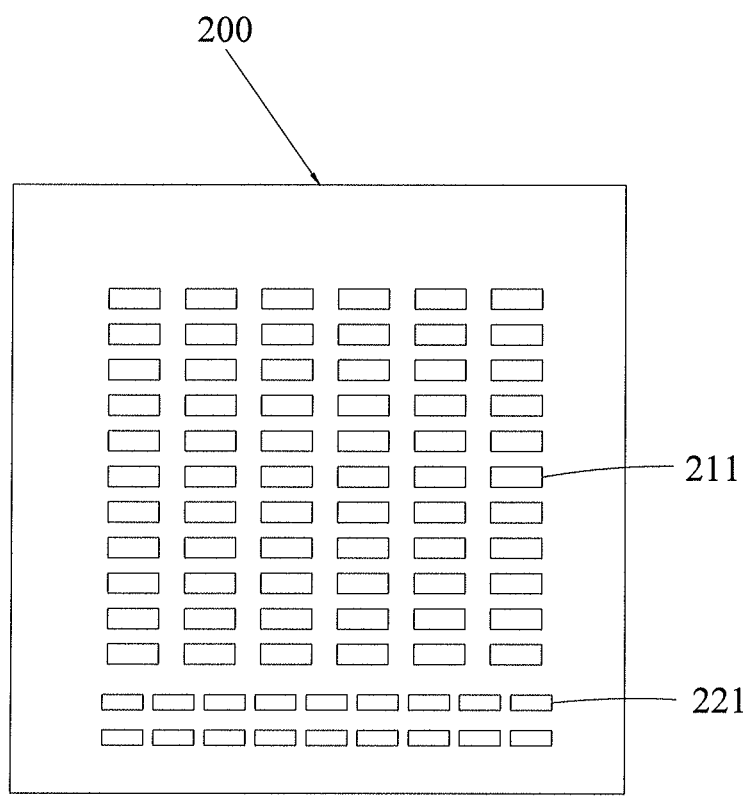
FIG. 4 is a front view of a cabinet in a cooling system according to an embodiment of the present disclosure.
Figure 5:
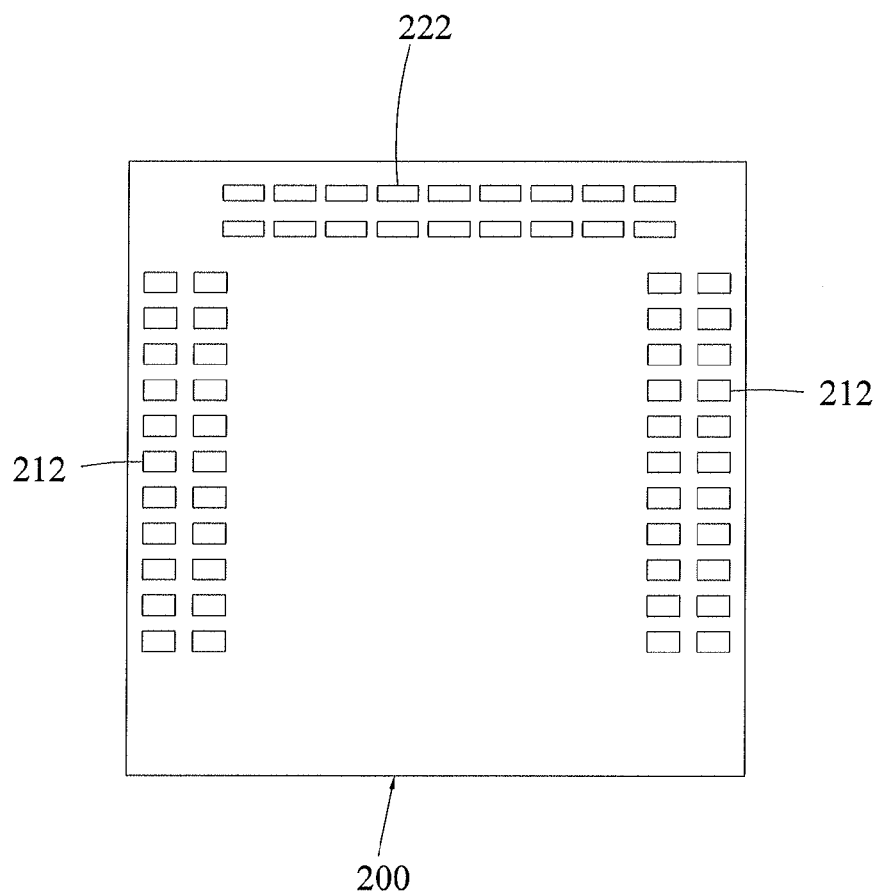
FIG. 5 is a back view of a cabinet in a cooling system according to an embodiment of the present disclosure.

As shown in FIG. 4 and FIG. 5, the first cooling air duct includes a first air inlet 211, a first air outlet 212, and a first channel connected between the first air inlet 211 and the first air outlet 212, where the first air inlet 211 is arranged at the front side of a cabinet 200 and corresponds to the region of the front circuit board 110, and the first air outlet 212 is arranged at the back side of the cabinet 200 and corresponds to regions of two lateral sides of a circuit board assembly 100. The first channel extends from the first air inlet 211 to the backplane 120, and extends from the two lateral sides of the backplane 120 to the first air outlet 212 at the back side of the cabinet 200. When the cooling system is working, the air inhaled into the first channel from the front area of the cabinet 200 firstly flows into the spaces between each front circuit board 110, and can directly blow to the front circuit board 110 to cool the front circuit board 110 and one surface of the backplane 120. After being blocked and distributed by the backplane 120, the air in the spaces of the front circuit board 110 is distributed into two lateral sides, and is discharged from the first air outlet 212 at the back side of the cabinet 200.

Specifically, the second cooling air duct includes a second air inlet 221, a second air outlet 222, and a second channel connected between the second air inlet 221 and the second air outlet 222, where the second air inlet 221 is arranged at the front side of the cabinet 200 and corresponds to the lower part region of the front circuit board 110, and the second air outlet 222 is arranged at the back side of the cabinet 200 and corresponds to the upper end region of the rear circuit board 130. In this embodiment, two groups of first air outlets are arranged. The two groups of first air outlets 212 are all arranged at the back side of the cabinet 200 and correspond to regions of the two lateral sides of the circuit board assembly 100 respectively. The second channel extends from the second air inlet 221 to the back side of the cabinet 200 along the lower end of the circuit board assembly 100, and upward to the second air outlet 222 along the back side of the cabinet 200. The air inhaled from the front area of the cabinet 200 into the second channel firstly flows through the lower part of the front circuit board 110 to the lower end of the rear circuit board 130. Because the second air outlet 222 is arranged at the back side of the cabinet 200 and corresponds to the upper end region of the rear circuit board 130, the air flows upward from the lower end of the rear circuit board 130, and flows through the spaces between each rear circuit board 130, and then is discharged from the second air outlet 222 on the cabinet 200, thereby cooling the rear circuit board 130 and the other surface of the backplane 120. The cooling air duct is designed perfectly to facilitate the cooling. In addition, the hot air has a low density and easily flows up to the top of the cabinet 200. Besides, the second air outlet 222 is arranged at the back side of the cabinet 200 and corresponds to the upper part of the rear circuit board 130, which facilitates to discharge the hot air out of the cabinet 200, thereby increasing the cooling efficiency. The cooling system of the present disclosure is able to properly cool the circuit board assembly 100 in the orthogonal architecture, without causing hybrid air flows between the first cooling air duct and the second cooling air duct, and achieve an optimum cooling effect, which facilitates to ensure the stable and continuous operation of the device and reduce the power consumption of the device, prolong the service life of the device, and increase the product reliability. In addition, the cooling system can meet a strict environment requirement of front-air-in and rear-air-out, and is applicable to an equipment room environment with special requirements. For an environment without the requirement of front-air-in and rear-air-out, the first air outlet 212 may also be arranged at the lateral sides of the cabinet 200 and other proper locations, which should all fall within the protection scope of the present disclosure.

More specifically, as shown in FIG. 5, a first fan assembly 310 is arranged at the first air outlet 212 and configured to inhale air from the first air inlet 211 and discharge the air from the first air outlet 212, so that the air can flow through the first channel. The first fan assembly 310 may include multiple fans arranged in parallel. In this embodiment, the first fan assembly 310 is arranged inside the cabinet 200 and is located at the first air outlet 212; two groups of the first fan assemblies 310 are arranged and located at the two first air outlets 212 respectively, so that the air is inhaled from the first air inlet 211 and discharged from the first air outlet 212.

More specifically, a second fan assembly 320 is arranged at the second air outlet 222 and configured to inhale air from the second air inlet 221 and discharge the air from the second air outlet 222. In this embodiment, the second fan assembly 320 is arranged inside the cabinet 200 and is located at the second air outlet 222; one group of second fan assemblies 320 is arranged to inhale air from the outside of the cabinet 200 and discharge the air from the second air outlet 222. After cold air outside the cabinet 200 flows into the cabinet 200, the cold air flows through the spaces between the rear circuit boards 130 to cool the rear circuit boards 130 properly. In addition, the air flowing through the front circuit board 110 and the rear circuit board 130 is all cold air directly inhaled from the outside of the cabinet 200 to the inside of the cabinet 200, which further increases the cooling effect.

Further, a first dust screen is arranged at the first air inlet 211 and a second dust screen is arranged at the second air inlet 221 to prevent dusts from entering into the cabinet 200.

Specifically, as shown in FIG. 5, the first air inlet 211, the second air inlet 221, the first air outlet 212, and the second air outlet 222 are all formed by multiple rectangular holes arranged densely. In addition, the first air inlet 211, the second air inlet 221, the first air outlet 212, and the second air outlet 222 may also be designed in other proper structures, for example, circular holes arranged densely or an individual large hole and a dust screen is arranged in the large hole, which also fall within the protection scope of the present disclosure.

An embodiment of the present disclosure also provides an electronic device, including a cabinet 200 and a circuit board assembly 100 arranged inside the cabinet 200, where the electronic device includes the above cooling system. The electronic device may be a communication device, a computer host, a server and so on, which all fall within the protection scope of the present disclosure. This embodiment uses a communication device as an example. The circuit board assembly 100 may adopt an orthogonal architecture, in which the front circuit board 110 may be an Ethernet line card and the rear circuit board 130 may be a switching line card. By making both sides of the backplane 120 be directly connected to the Ethernet line card and the switching card respectively, the cabling length of the high-speed link on the backplane 120 is reduced to zero. In this way, the end-to-end high-speed link is the shortest, and the insertion loss is the smallest, and the high-speed links of the entire system work stably. The circuit board assembly 100 is placed inside the cabinet 200, and the front circuit board 110 faces the front and the rear circuit board 130 faces the back. In this embodiment, the front circuit board 110 is arranged horizontally, and multiple front circuit boards 110 are arranged vertically and alternately and are close to the front side of the cabinet 200, where the front side of the cabinet 200 may be a cabinet door; the rear circuit board 130 is arranged vertically and is close to the back side of the cabinet 200, and multiple rear circuit boards 130 are arranged horizontally and alternately. The lower part of the circuit board assembly 100 is supported by a support bar, and the upper part of the circuit board assembly 100 is connected to the upper end of the cabinet 200. The two lateral sides and the lower part of the circuit board assembly 100 are separated from the inner wall of the cabinet 200 to form air channels of the first cooling air duct and the second cooling air duct. The first air inlet 211 is arranged at the front side of the cabinet 200 and corresponds to the region of the front circuit board 110, and the first air outlet 212 is arranged at the back side of the cabinet 200 and corresponds to regions of two lateral sides of the circuit board assembly 100. After air enters into the cabinet 200 from the first air inlet 211, it directly flows into the backplane 120 through the spaces between the front circuit boards 110; being blocked by the backplane 120, the air is distributed into two lateral sides, and is finally discharged out of the cabinet 200 from the first air outlet 212. The second air inlet 221 is arranged at the front side of the cabinet 200 and corresponds to the lower part region of the front circuit board 110, and the second air outlet 222 is arranged at the back side of the cabinet 200 and corresponds to the upper end region of the rear circuit board 130. The air enters into the cabinet 200 from the second air inlet 221, and then flows into the lower end of the rear circuit board 130 along the lower part of the front circuit board 110; under the function of the second fan assembly 320, the air flows into the second air outlet 222. In this way, the air at the lower end of the rear circuit board 130 flows up to flow through the spaces between the rear circuit boards 130 and to cool the rear circuit boards 130, and then is discharged out of the cabinet 200 from the second air outlet 222.

A cooling system and an electronic device including the cooling system are provided in the present disclosure, where: by arranging a first cooling air duct and a second cooling air duct, the first cooling air duct allows air to enter from the front side of a cabinet 200 corresponding to the central region of the circuit board assembly 100, after the air flows through the first half part of the circuit board assembly, the hot air is distributed into two lateral sides of the circuit board assembly 100, and discharged out of the cabinet 200 from the back side of the cabinet 200; and the second cooling air duct allows air to enter from the front side of the cabinet 200 corresponding to the lower end region of the circuit board assembly 100, with the air vertically flowing through the second half part of the circuit board assembly from the bottom to the top. There is no hybrid air flows between the first cooling air duct and the second cooling air duct, and the device has a high cooling efficiency and small power consumption, thereby facilitating to increase the reliability of the device and prolong the service life of the device.

Although the present disclosure has been described through some preferred embodiments, the disclosure is not limited to such embodiments. It is apparent that those skilled in the art can make various modifications, equivalent replacements, and improvements to the disclosure without departing from the spirit and principle of the disclosure. The modifications, equivalent replacements, and improvements should fall within the protection scope of the present disclosure.

What is claimed is:

1. A cooling system, configured to cool an orthogonal circuit board assembly in an orthogonal architecture, wherein the orthogonal circuit board assembly comprises one or more front circuit board which are orthogonally arranged in relation to one or more rear circuit board inside a cabinet, wherein:

the orthogonal circuit board assembly comprises a backplane, the one or more front circuit board located in a front portion of the orthogonal circuit board assembly, and the one or more rear circuit board located in a rear portion of the orthogonal circuit board assembly, the one or more front circuit board is inserted on one surface of the backplane, the one or more rear circuit board is inserted on the other surface of the backplane, and the one or more rear circuit board and the one or more front circuit board are orthogonal to each other;

wherein the cabinet comprises a front side, a back side opposite to the front side, two opposite lateral sides, a top side, and a bottom side opposite to the top side, an upper end of the orthogonal circuit board assembly is connected to the top side of the cabinet, a lower end of the orthogonal circuit board assembly is spaced apart from the bottom side of the cabinet, and the two lateral sides of the circuit board assembly are spaced apart from the two lateral sides of the cabinet;

wherein the cooling system comprises:

a first cooling air duct that allows first air flows from the front side of the cabinet corresponding to a region of the one or more front circuit board into the cabinet and flows throughout the front portion of the orthogonal circuit board assembly, wherein the first cooling air duct is substantially disposed in a central region of the front side of the cabinet which is spaced away from all four lateral sides of the cabinet, in order that first air flows from the central region of the front side be distributed towards both lateral sides of the one or more front circuit board, and be discharged out to first openings in the opposite back side, which are along both lateral sides of the cabinet; and a second cooling air duct which is either disposed above or below the first cooling duct in order that second air flows enter from the front side into the cabinet and travels vertically from one end towards another end of the one or more rear circuit board to be discharged out to second openings which are disposed on an opposite end away from the second air duct and in the back side of the cabinet.

2. The cooling system according to claim 1, wherein the second cooling air duct comprises a second air inlet, a second air outlet, and a second channel connected between the second air inlet and the second air outlet, wherein the second air inlet is arranged at the front side of the cabinet and corresponds to the lower part region of the front circuit board and the second air outlet is arranged at the back side of the cabinet and corresponds to an upper part region of the rear circuit board.

3. The cooling system according to claim 1, wherein a first fan assembly is arranged at the first air outlet and configured to inhale the first air from the first air inlet and discharge the first air from the first air outlet.

4. The cooling system according to claim 2, wherein a second fan assembly is arranged at the second air outlet and configured to inhale the second air from the second air inlet and discharge the second air from the second air outlet.

5. The cooling system according to claim 2, wherein a first dust screen is arranged at the first air inlet and a second dust screen is arranged at the second air inlet.

6. An electronic device, comprising a cabinet and an orthogonal circuit board assembly arranged inside the cabinet, wherein the electronic device comprises a cooling system, wherein:

the orthogonal circuit board assembly comprises a backplane, one or more front circuit board located in a front portion of the orthogonal circuit board assembly, and one or more rear circuit board located in a rear portion of the orthogonal circuit board assembly, the one or more front circuit board is inserted on one surface of the backplane, the one or more rear circuit board is inserted on the other surface of the backplane, and the one or more rear circuit board and the one or more front circuit board are orthogonal arranged back to back against each other;

wherein the cabinet comprises a front side, a back side opposite to the front side, two opposite lateral sides, a top side, and a bottom side opposite to the top side, an upper end of the orthogonal circuit board assembly is connected to the top side of the cabinet, a lower end of the orthogonal circuit board assembly is spaced apart from the bottom side of the cabinet, and the two lateral sides of the circuit board assembly are spaced apart from the two lateral sides of the cabinet;

wherein the cooling system comprises:

a first cooling air duct that allows first air flows from the front side of the cabinet corresponding to a region of the one or more front circuit board into the cabinet and flow throughout the front portion of the orthogonal circuit board assembly, wherein the first cooling air duct is substantially disposed in a central region of the front side of the cabinet which is spaced away from all four lateral sides of the cabinet, in order that first air flows from the central region of the front side be distributed towards both lateral sides of the one or more front circuit board, and be discharged out of the first openings in the opposite back side, which are along both lateral sides of the cabinet; and a second cooling air duct which is either disposed above or below the first cooling duct in order that second air flows enter from the front side into the cabinet and travels vertically from one end towards another end of the one or more rear circuit board, to be discharged out to second openings which are disposed on an opposite end away from the second air duct and in the back side of the cabinet.

7. The electronic device according to claim 6, wherein the second cooling air duct comprises a second air inlet, a second air outlet, and a second channel connected between the second air inlet and the second air outlet, wherein the second air inlet is arranged at the front side of the cabinet and corresponds to the lower part region of the front circuit board and the second air outlet is arranged at the back side of the cabinet and corresponds to an upper part region of the rear circuit board.

* * * * *